(12) United States Patent
Shi et al.

(10) Patent No.: US 8,674,751 B2
(45) Date of Patent: Mar. 18, 2014

(54) REFERENCE GENERATION IN AN INTEGRATED CIRCUIT DEVICE

(75) Inventors: Justin Shi, Ann Arbor, MI (US); Yue-Der Chih, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 13/447,594

(22) Filed: Apr. 16, 2012

(65) Prior Publication Data

US 2013/0271207 A1    Oct. 17, 2013

(51) Int. Cl.
*G05F 1/10* (2006.01)
*G05F 3/02* (2006.01)

(52) U.S. Cl.
USPC ........................................... 327/536; 327/538

(58) Field of Classification Search
USPC ............... 327/536, 540, 538; 363/59–60; 323/315–316
See application file for complete search history.

(56) References Cited

U.S. PATENT DOCUMENTS

| | | | |
|---|---|---|---|
| 7,463,516 B2 | 12/2008 | Ban | |
| 7,579,902 B2* | 8/2009 | Frulio et al. | 327/536 |
| 7,791,944 B2 | 9/2010 | Barkley | |
| 7,843,712 B2* | 11/2010 | Lee | 363/60 |
| 2002/0118571 A1* | 8/2002 | Roohparvar | 365/185.18 |
| 2004/0004876 A1* | 1/2004 | Choi et al. | 365/202 |
| 2006/0147062 A1* | 7/2006 | Niwa et al. | 381/113 |
| 2008/0285339 A1 | 11/2008 | Barkley | |
| 2011/0050670 A1* | 3/2011 | Kim | 345/211 |

* cited by examiner

*Primary Examiner* — Quan Tra
(74) *Attorney, Agent, or Firm* — Duane Morris LLP

(57) ABSTRACT

A method for generating a reference voltage in an integrated circuit device that is powered by a low voltage power includes generating a coarse first reference voltage using a coarse reference generator, routing the coarse first reference voltage to a boost regulator as an input reference voltage by a hand-off switch circuit, the boost regulator generating an initial-state stepped-up supply based on the first reference voltage, and generating at least two outputs of a second, more accurate, reference voltage from the stepped-up supply voltage using a fine-resolution reference generator. The second reference can be then looped back to the boost regulator, thus, generating a more accurate steady-state stepped-up supply voltage.

15 Claims, 8 Drawing Sheets

REFERENCE GENERATION IN AN INTEGRATED CIRCUIT DEVICE

FIELD

The disclosed subject matter generally relates to reference generating circuits and particularly to reference generating circuits for an integrated circuit device powered by a low voltage power.

BACKGROUND

In many integrated circuit devices such as system-on-chip devices, reference voltage generating circuits generate accurate reference voltages for use by a number of functional circuit units.

DETAILED DESCRIPTION

Figure 1:
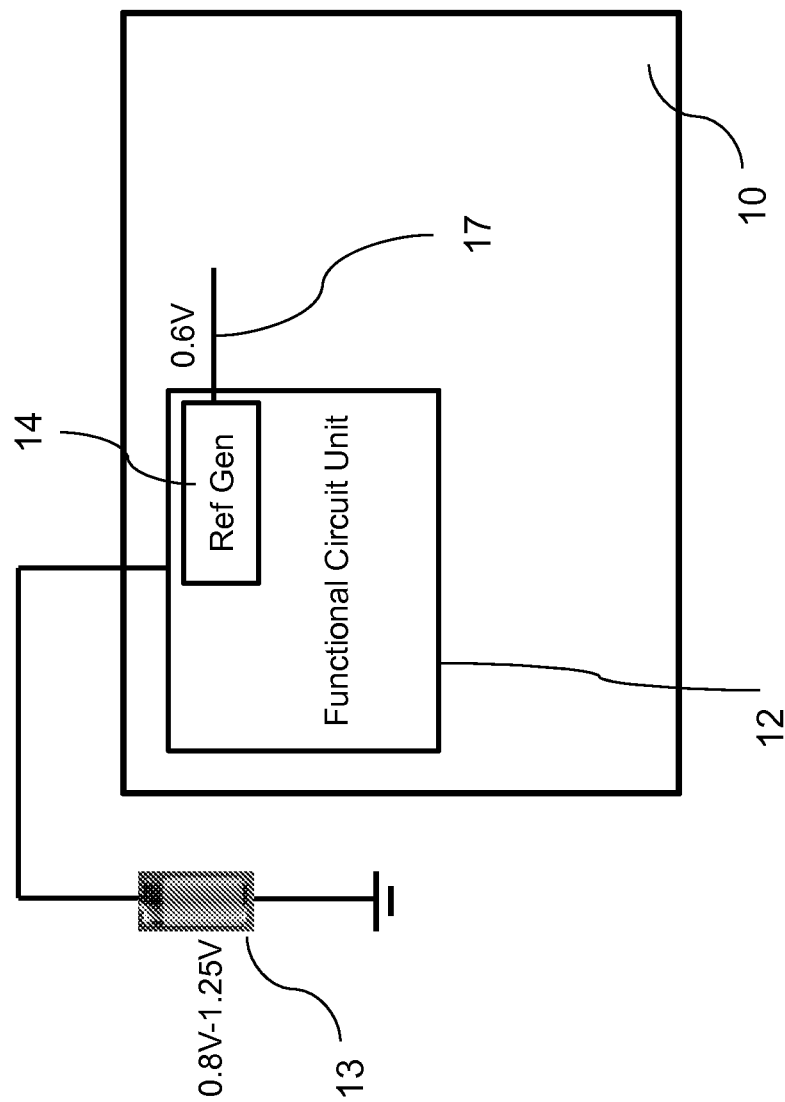
FIG. 1 illustrates a conventional system on chip circuitry with a flash memory module.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Many integrated circuit ("IC") devices are driven by a 1.8V voltage supply. Flash memory modules in system-on-chip (SOC) devices being one example. Such flash memory modules generate their own reference voltage, typically 1.25V, from the 1.8V supply voltage using a reference voltage generator. However, with the proliferation of portable electronic device applications, such as digital audio players, mobile phones, digital cameras, video games, etc., the requirement for lower power consumption has led to the development of various SOC devices that utilize low voltage power. In a typical SOC for portable applications, the low voltage power can be between about 0.8V-1.25V provided by a voltage source such as a single cell battery.

FIG. 1 is a schematic illustration of an example of a reference generating circuit for an IC device 10 powered by a low voltage power. Such IC device can be an SOC device used in portable electronic device applications. A functional circuit unit 12 is powered by a low voltage power supply 13 that provides low voltage power at 0.8V-1.25V. The 0.8V-1.25V supply voltage will be referred to herein as the "low voltage power." The functional circuit unit 12 has a reference voltage generator 14 that generates a reference voltage of 0.6V from the low voltage power. The reference voltage is also generally provided to other functional circuit units inside the integrated circuit device 10 as well. In one example, the functional circuit unit 12 can be an embedded flash memory module and the reference voltage is used for driving a wordline for programming the flash memory cells in the flash memory module.

The problem, however, with this conventional set up is that when the supply voltage is below 1.0V, generating an accurate reference voltage becomes problematic. For a silicon-based integrated circuit device, the reference voltage of 0.6V in the conventional integrated circuit device 10 set up illustrated in FIG. 1 can result in 4.5 mV/° C. variability.

According to an embodiment of the present disclosure, a novel reference generating circuit for an IC device powered by a low voltage power is disclosed. Such device comprises a coarse reference voltage generator, a boost regulator, a hand-off switch circuit, and a fine-resolution reference voltage generator. When the IC device is powered "on" by a low voltage power, the low voltage power also powers the coarse reference generator. The coarse reference voltage generator generates a 0.6V coarse reference voltage from the low voltage power. The IC device also comprises a boost regulator configured for generating a 1.8V stepped-up supply from an input reference voltage. As used herein, a boost regulator refers to a circuitry that regulates the voltage of the output to a predetermined value.

At initial power up of the IC device, hand-off switch circuit provides the 0.6V coarse reference voltage to the boost regulator as the input reference voltage. The boost regulator then takes the input reference voltage, which at this point is the coarse reference voltage 0.6V, and steps it up to an 1.8V initial-state stepped-up supply for a functional circuit unit.

The functional circuit unit is provided with a fine-resolution reference voltage generator which takes the 1.8V stepped-up supply from the boost regulator and produces a more accurate second reference voltage of 1.2V. The fine-resolution reference voltage generator is provided with two outputs. The first output delivers the second reference voltage 1.2V to a divider that steps the second reference voltage 1.2V down to 0.6V which is, in turn, fed to the hand-off switch circuit. This stepped-down second reference voltage 0.6V is more accurate than the first reference voltage 0.6V generated by the coarse reference voltage generator. The second output of the fine-resolution reference voltage generator delivers the second reference voltage 1.2V to the hand-off switch circuit as a ready signal for triggering the hand-off switch circuit to switch. When the ready signal triggers the hand-off switch circuit, the hand-off switch circuit is configured to replace the 0.6V coarse reference voltage with the more accurate stepped-down second reference voltage 0.6V as the input reference voltage for the boost regulator. The second reference voltage 0.6V is 2% to 5% more accurate than the coarse first reference voltage. The boost regulator then generates a 1.8V steady-state stepped-up supply voltage that is more accurate than the 1.8V initial-state stepped-up supply.

Figure 2:
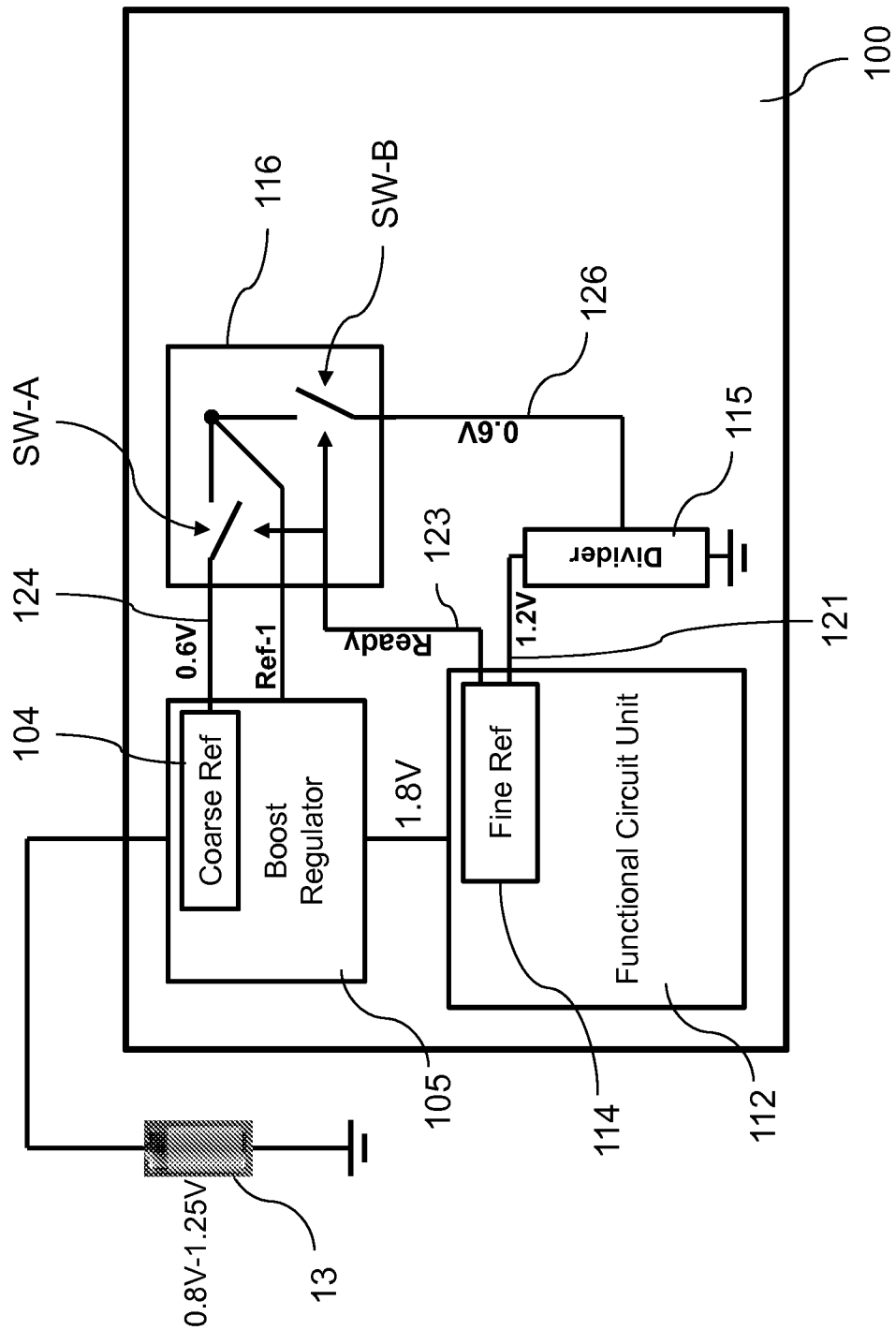
FIG. 2 is a block diagram of a system on chip circuitry according to an embodiment of the present disclosure.

Such IC device 100 is illustrated in detail in FIG. 2. The IC device 100 is provided with a boost regulator 105 and a coarse reference voltage generator 104 associated with the boost regulator 105. When the IC device 100 is powered on by applying the low voltage power from the low voltage supply 13, the low voltage power powers the coarse reference generator 104. The coarse reference generator 104 takes the low voltage power and generates a 0.6V coarse reference voltage. The low voltage supply 13 can be a power source such as a single cell battery. The 0.6V coarse reference voltage 124 is routed to the boost regulator 105 by a hand-off switch circuit 116 as a Ref-1 input. The boost regulator 105 takes the Ref-1 input, which at this point is the coarse reference voltage 0.6V, and steps it up to a 1.8V stepped-up supply voltage 120 for a functional circuit unit 112. This coarse stepped-up supply voltage 120 is referred to herein as an initial-state stepped-up supply voltage. The term initial-state being used because the boost regulator only generates this coarse stepped-up supply voltage at the initial power up of the IC device 100 and subsequently switches over to generating a more accurate stepped-up supply during the subsequent operational mode described below.

Associated with the functional circuit unit 112 is a fine-resolution reference voltage generator 114 which takes the 1.8V initial-state stepped-up supply voltage 120 from the boost regulator 105 and produces a more accurate second reference voltage of 1.2V. The functional circuit unit 112 is operatively configured for receiving the stepped-up supply voltage from the boost regulator 105 and the second reference voltage from the fine-resolution reference voltage generator 114. The fine-resolution reference voltage generator 114 is provided with two outputs 121 and 123. The first output 121 delivers the second reference voltage 1.2V to a divider 115 that steps the second reference voltage 1.2V down to 0.6V which is, in turn, fed to the hand-off switch circuit 116. This 0.6V stepped-down second reference voltage 126 is more accurate than the coarse first reference voltage 0.6V generated by the coarse reference voltage generator 104 by 2% to 5%.

The second output 123 of the fine-resolution reference voltage generator 114 delivers the second reference voltage 1.2V to the hand-off switch circuit 116 as a ready signal for triggering the hand-off switch circuit 116 to switch. When the ready signal triggers the hand-off switch circuit 116, the hand-off switch circuit is configured to replace the input reference voltage Ref-1 for the boost regulator 105 from the 0.6V coarse reference voltage 124 with the 0.6V stepped-down second reference voltage 126.

The hand-off switch circuit 116 is configured with two switches SW-A and SW-B. Although both switches are shown in FIG. 2 in their open modes, the switch SW-A is configured to be in a closed mode until triggered by the ready signal received from the fine-resolution reference voltage generator 114. The switch SW-B is configured to be in the open mode until triggered by the ready signal received from the fine-resolution reference voltage generator 114.

Figure 3A:
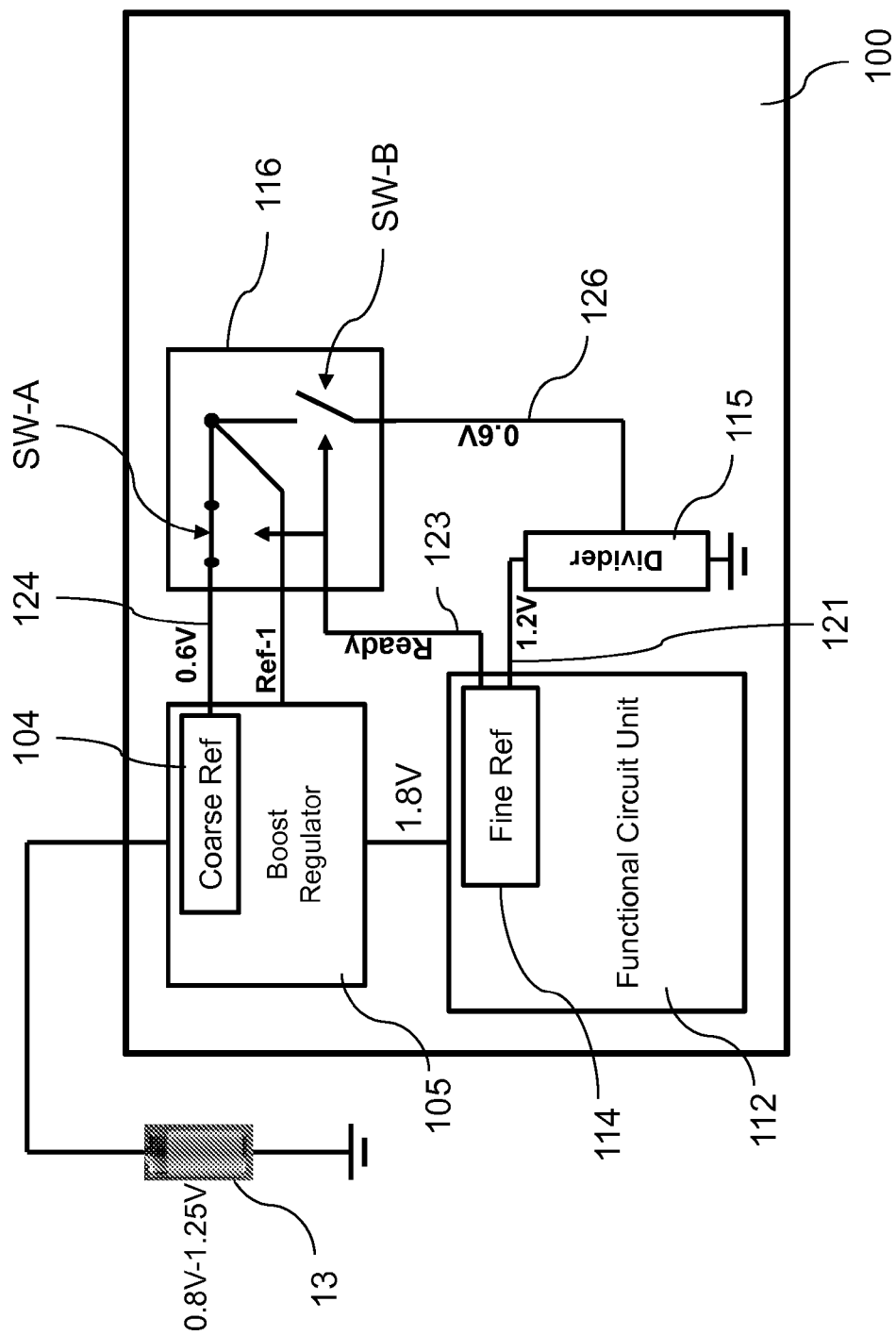
FIG. 3A is an illustration of the system on chip circuitry according to an embodiment in its initial state.

FIG. 3A shows the IC device 100 in its initial state before the hand-off switch circuit 116 is triggered. At the onset of the IC device 100 being powered up, in the initial state, the switch SW-A is in its closed mode and the coarse reference voltage 0.6V 124 is routed to the Ref-1 input of the boost regulator 105 as an input reference voltage to the boost regulator 105. As discussed above, in the initial state, the boost regulator 105 generates the initial-state stepped-up supply.

Figure 3B:
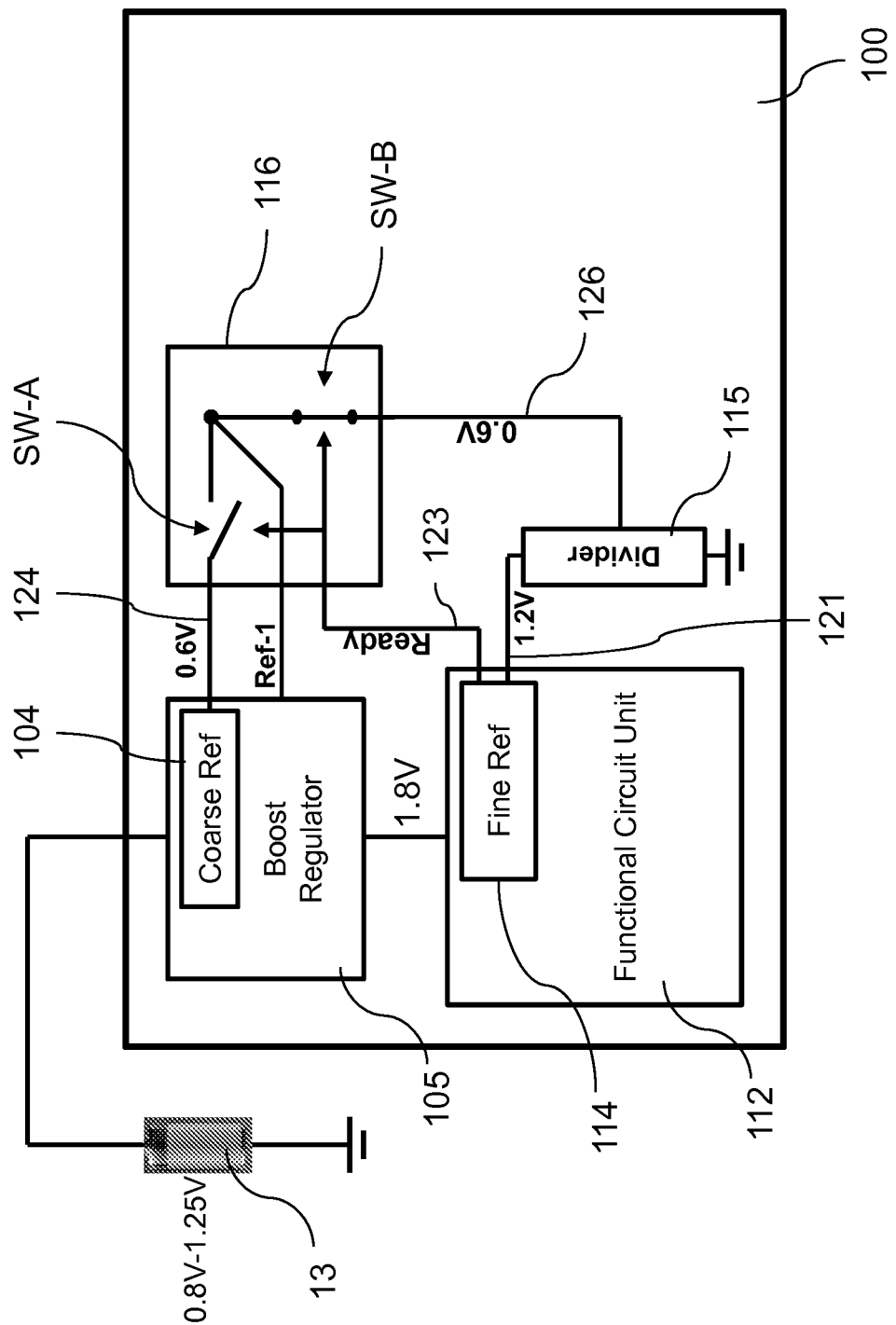
FIG. 3B is an illustration of the system on chip circuitry according to an embodiment in its operational state.

Referring to FIG. 3B, when the ready signal from the fine-resolution reference voltage generator 114 triggers the hand-off switch circuit 116, the switch SW-A opens and the switch SW-B closes and the IC device 100 is now in the operational state. In the operational state, the coarse reference voltage 0.6V 124 is cut off and the more accurate stepped-down second reference voltage 0.6V from the divider 115 is routed to the Ref-1 input of the boost regulator 105 as an input reference voltage to the boost regulator 105.

Thus, in the operational mode, the boost regulator 105 is driven by the more accurate stepped-down second reference voltage 0.6V and generates a more accurate steady-state stepped-up supply voltage 120 1.8V. The more accurate stepped-up supply voltage 120 1.8V is referred to herein as the steady-state stepped-up supply voltage. The term steady-state referring to the fact that in the operational mode, the boost regulator 105 steadily generates the more accurate stepped-up supply voltage 120 1.8V. This in turn allows the fine-resolution reference voltage generator 114 to generate more accurate second reference voltage 1.2V, which enhances the operation of the functional circuit unit 112 by providing the more accurate and stable second reference voltage.

Additionally, the stepped-down second reference voltage 0.6V from the divider 115 is also now more accurate and the hand-off switch circuit 116, which remains in the triggered state, continues to hand off the stepped-down second reference voltage to the Ref-1 input of the boost regulator. This loop will remain as such as long as the IC device 100 remains powered on. In an example of the IC device 100, the functional circuit unit 112 can be an embedded flash memory module and the more accurate second reference voltage 1.2V is used for driving the wordline for programming the flash memory cells in the embedded flash memory module.

The accurate supply voltage and reference voltage are particularly important to flash memory applications. Precise control of the reference voltage allows faster programming, erase, and read operations for the flash memory module. For instance, the programming or erase operation of the flash memory demands an elevated wordline voltage to create electron injection or tunneling in the flash memory array. After every program or erase cycle, the flash memory array is checked for proper programming or erasure. If the elevated wordline is not finely controlled, this operation may need to be repeated multiple times to achieve the desirable state.

Faster operation of the flash memory module also enables faster response times for the overall electrical system or system-on-a-chip. When the reference voltage or supply voltage of the flash memory module is not precisely controlled, such as the case when the supply voltage is unstable or always varying, the flash memory module may take more time to execute the correct operations it is instructed to, thus slowing down the overall response time of the system or end application.

In the configuration for generating reference voltage in the IC device 100 according to the present disclosure, the coarse reference voltage generator 104 and the fine-resolution reference voltage generator 114 are conventionally available reference voltage generators. Examples of such reference voltage generators are CMOS bandgap reference generator circuits. The disclosed configuration allows the second reference voltage 1.2V to be generated with about 2 mV/° C. accuracy. This is an accuracy improvement of about 3-6% over the conventional reference voltage generation from sub-1-V supply. This can be achieved without the cost of designing a highly accurate reference voltage generator that would generate accurate reference voltage directly from a low voltage supply. The reference voltage generation configuration of this disclosure can expect to achieve a voltage variation close to 0.15-0.3%

Thus, the IC device 100 configured as shown in FIGS. 2, 3A and 3B, allows the functional circuit unit 112 to operate from more stable and accurate reference voltage even though the IC device 100 is being powered by the low voltage supply 13.

Figure 4:
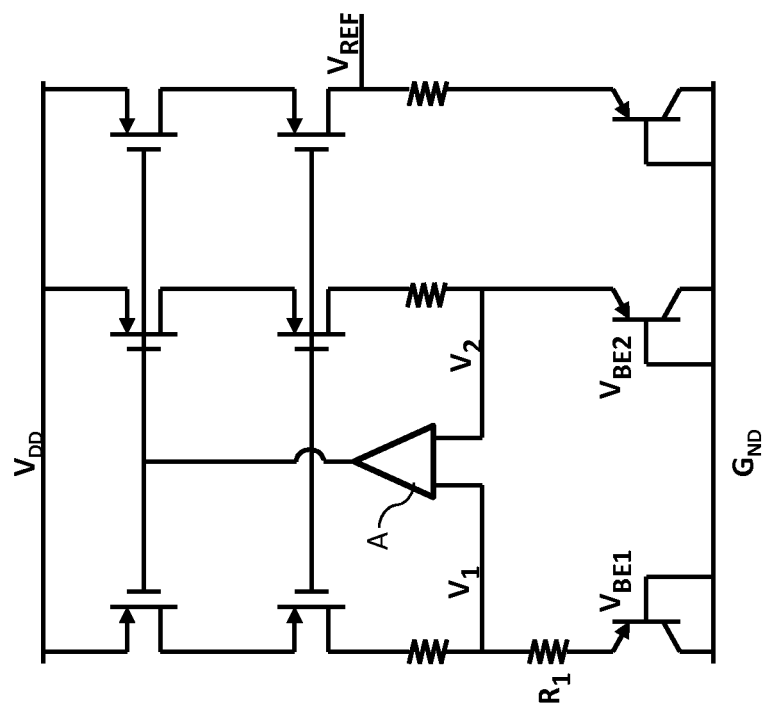
FIG. 4 shows an example of a 1.8V reference voltage generator.

An example of a typical bandgap reference voltage generator circuit operating from a 1.8V supply is shown in FIG. 4. An op-amp A is used to equalize two voltages, $V_1$ and $V_2$, from two equal current bipolar transistors, to generate a current proportional to absolute temperature ("PTAT"). That same current is then mirrored to another branch with another bipolar transistor to generate the temperature independent reference voltage $V_{REF}$. Such reference voltage generator can be used for the fine-resolution reference voltage generator 114, with high accuracy and high power supply rejection ratio ("PSRR").

Figure 5B:
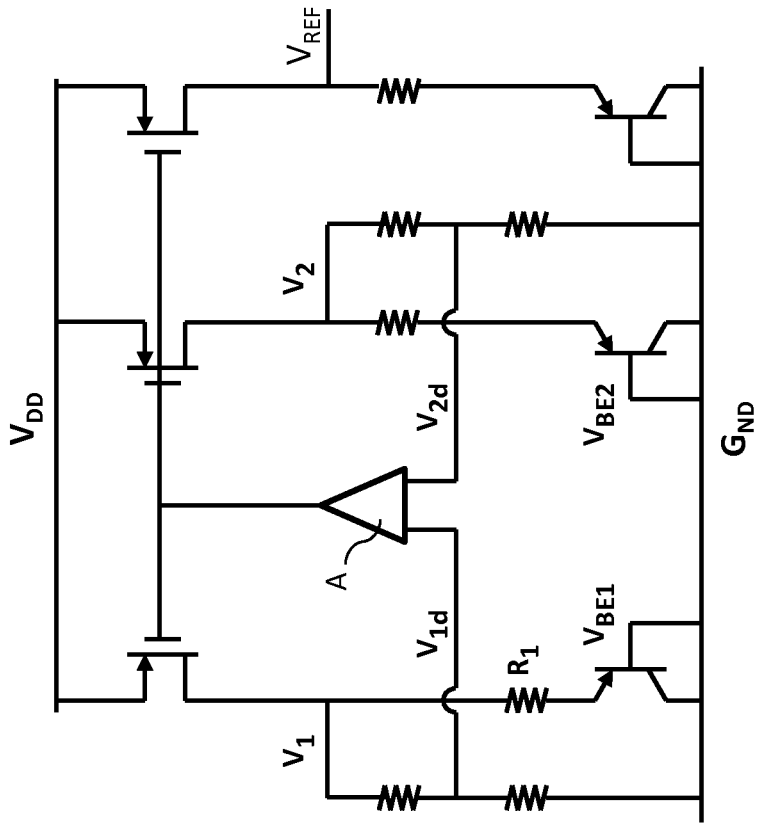
FIGS. 5A and 5B are examples of a reference voltage generator that operates from sub-1 volt source.
Figure 5A:
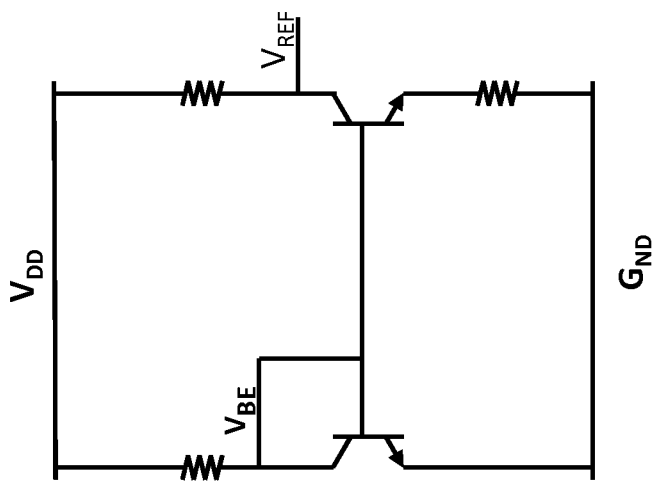

When the reference generator is powered from a low voltage power, this reference generator circuit cannot function properly because of the lower headroom. Examples of other reference voltage generators 104, which can operate under 1V, are shown in FIGS. 5A and 5B. In FIG. 5A, a crude reference generator is used to balance the temperature coefficients of the bipolar transistor and resistance value. In the example shown in FIG. 5B, the op-amp A's inputs are taken from resistor divided voltages $V_{1d}$ and $V_{2d}$ to reduce the common mode input level requirement of the op-amp A. This allows the reference voltage generator circuit to operate under 1 volt.

Figures 6A, 6B:
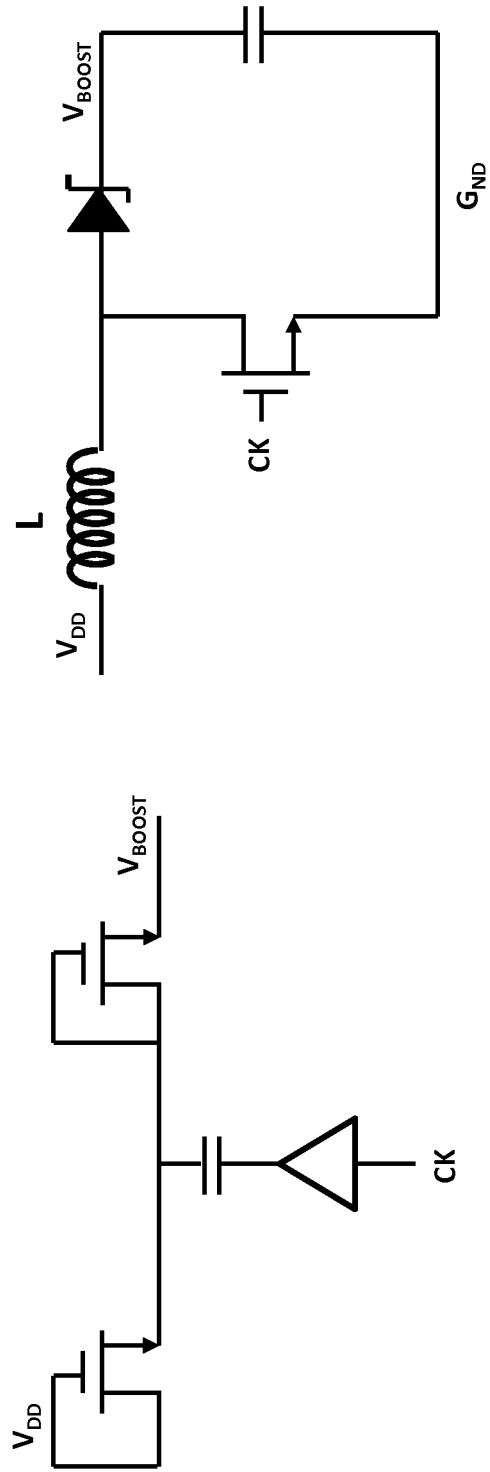
FIGS. 6A and 6B are examples of voltage boost regulator circuits.

Examples of the boost regulator circuit 105 are shown in FIGS. 6A and 6B. FIG. 6A shows a capacitive based charge pump circuit. This type of circuit stores energy in the capacitors (pre-charges the capacitor), then releases the energy (boosts the capacitor) to generate an elevated output. FIG. 6B shows an inductive boost converter circuit. This architecture stores and releases energy in the inductor to generate the boosted output. Either type of boost regulator can be used in 105.

Figure 7:
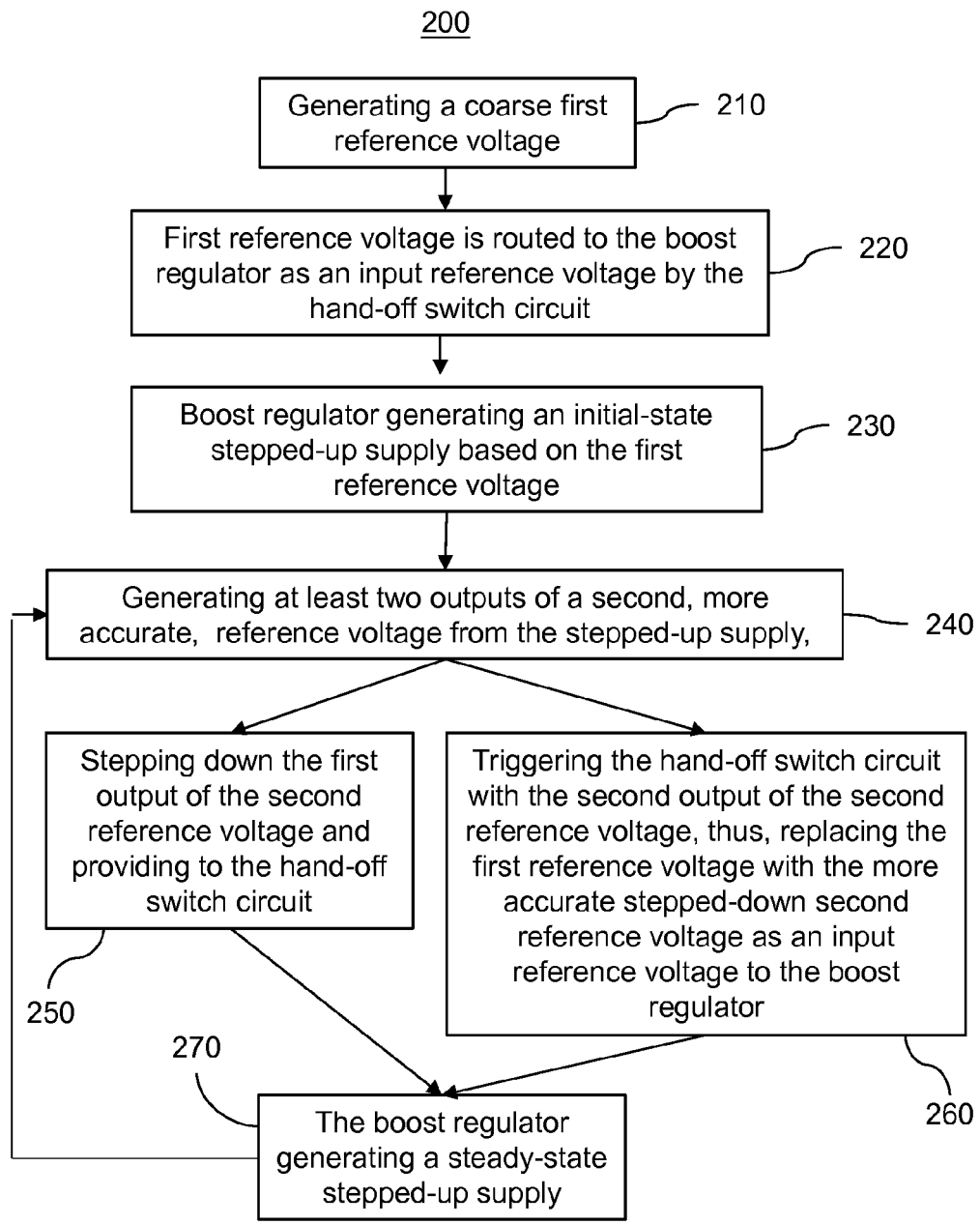
FIG. 7 is a flowchart in accordance with an embodiment of the present disclosure.
The figures are schematic illustrations and they are not drawn to scale.

FIG. 7 is a flowchart 200 for a method in accordance with an embodiment of the present disclosure. The method is performed by the IC device 100 to generate the more accurate second reference voltage 1.2V used by the functional circuit unit 112. The method is shown beginning with block 210 in which the boost regulator's coarse reference voltage generator 104 generates the 0.6V coarse first reference voltage 124. At 220, the 0.6V coarse first reference voltage 124 is routed to the boost regulator 105 by the hand-off switch 116 as Ref-1. At 230, the boost regulator 105 takes the 0.6V coarse first reference voltage Ref-1 and steps it up to 1.8V initial-state stepped-up supply voltage 120 that powers up the functional circuit unit 112. As mentioned above, the functional circuit unit 112 is operatively configured for receiving the initial-state stepped-up supply voltage 120. At 240, operating from the stepped-up voltage from the boost regulator 105 that is higher than the low voltage power, the fine-resolution reference voltage generator 114 associated with the functional circuit unit 112 generates at least two outputs 121 and 123 of a second, more accurate, reference voltage of 1.2V. At 250, the first of the two second reference voltage output 121 of 1.2V is stepped down to 0.6V by the divider 115 and fed to the hand-off switch circuit 116. At 260, which happens concurrently with the block 250, the second of the two second reference voltage output 123 of 1.2V is fed to the hand-off switch circuit 116 as the ready signal and triggers the hand-off switch circuit 116 to switch. Switching the hand-off switch circuit 116 replaces the coarse reference voltage 124 with the more accurate stepped-down second reference voltage 0.6V, coming from the divider 115, so that the stepped-down second reference voltage 0.6V is provided to the Ref-1 input of the boost regulator 105. At block 270, using the more accurate Ref-1 now being provided to the boost regulator, the boost regulator generates a steady-state stepped-up supply 1.8V which now powers the functional circuit unit 112.

At this point, the method loops back to the process of the block 240 and the fine-resolution reference voltage generator 114 of the functional circuit unit 112 continues to generate the at least two outputs 112 and 123 of the second, more accurate, reference voltage of 1.2V from the stepped-up supply voltage 1.8V 120 being provided by the boost regulator 105. However, unlike during the initial state of the device, the stepped-up supply voltage 1.8V is now the steady-state stepped-up supply voltage. As long as the boost regulator of the IC device 100 is being powered by the low voltage power, the process of the blocks 240, 250 and 270 will be repeated in a steady-state loop. The triggering of the hand-off switch circuit described in the block 260 only happen once when the IC device 100 is initially powered on. Once triggered, the hand-off switch circuit remains in the triggered mode.

Although the subject matter has been described in terms of exemplary embodiments, it is not limited thereto. Rather, the appended claims should be construed broadly, to include other variants and embodiments, which may be made by those skilled in the art.

What is claimed is:

1. A reference generating circuit for an integrated circuit device powered by a low voltage power, the reference generating circuit comprising:
   a coarse reference voltage generator that generates a coarse first reference voltage from the low voltage power;
   a boost regulator configured for generating a stepped-up supply voltage from an input reference voltage;
   a hand-off switch circuit configured for providing the first reference voltage as the input reference voltage for the boost regulator in response to receiving a trigger signal;
   a fine-resolution reference voltage generator configured for generating a second reference voltage and the trigger signal from the stepped-up supply voltage; and
   a divider that steps the second reference voltage down to a stepped-down second reference voltage which is, in turn, provided to the hand-off switch circuit, wherein the fine-resolution reference voltage generator comprises:
      a first output that delivers the second reference voltage to the divider; and
      a second output that delivers the second reference voltage to the hand-off switch circuit as the trigger signal fear triggering the hand-off switch circuit to switch and be configured to provide the stepped-down second reference voltage as the input reference voltage for the boost regulator rather than the first reference voltage,
   whereby the boost regulator thereafter generates a steady-state stepped-up supply voltage that is more accurate than an initial-state steped-up supply voltage.

2. The circuit of claim 1, wherein the low voltage power provides a voltage between 0.8V to 1.25V, the coarse first reference voltage is 0.6V, the stepped-up supply voltage is 1.8V, and the second reference voltage is 1.25V.

3. The circuit of claim 1, wherein the integrated circuit device is a system-on-chip device.

4. The circuit of claim 1, wherein the stepped-down second reference voltage is more accurate than the coarse first reference voltage by 2% to 5%.

5. An integrated circuit device powered by a low voltage power, the integrate circuit device comprising:
- a reference generating circuit powered by the low voltage power, the reference generating circuit comprising:
  - a coarse reference voltage generator that generates a coarse first reference voltage from the low voltage power;
  - a boost regulator configured for generating a stepped-up supply voltage from an input reference voltage;
  - a hand-off switch circuit configured for providing the first reference voltage as the input reference voltage for the boost regulator in response to receiving a trigger signal;
  - a fine-resolution reference voltage generator configured for generating a second reference voltage and the trigger signal from the stepped-up supply voltage;
  - a divider that steps the second reference voltage down to a stepped-down second reference voltage which is, in turn, provided to the hand-off switch circuit, wherein the fine-resolution reference voltage generator comprises:
    - a first output that delivers the second reference voltage to the divider; and
    - a second output that delivers the second reference voltage to the hand-off switch circuit as the trigger signal for triggering the hand-off switch circuit to switch and be configured. to provide the stepped-down second reference voltage as the input reference voltage for the boost regulator rather than the first reference voltage, whereby the boost regulator thereafter generates a steady-state stepped-up supply voltage that is more accurate than an initial-state stepped-up supply voltage; and
- a functional circuit unit that is operatively configured for receiving the initial-state stepped-up supply voltage from the boost regulator and the second reference voltage.

6. The device of claim 5, wherein the functional circuit unit is a flash memory module.

7. The device of claim 5, wherein the low voltage power provides a voltage between 0.8V to 1.25V, the coarse first reference voltage is 0.6V, the stepped-up supply voltage is 1.8V, and the second reference voltage is 1.25V.

8. The device of claim 5, wherein the integrated circuit device is a system-on-chip device.

9. The device of claim 5, wherein the stepped-down second reference voltage is more accurate than the coarse first reference voltage by 2% to 5%.

10. The device of claim 5, wherein the functional circuit unit is a flash memory module.

11. A method for generating a reference voltage in an integrated circuit device comprising a functional circuit unit, the integrated circuit device being powered by a low voltage power, the method comprising:
- (a) generating a coarse first reference voltage using a coarse reference generator;
- (b) routing the coarse first reference voltage to a boost regulator as an input reference voltage by a hand-off switch circuit;
- (c) the boost regulator generating a stepped-up supply voltage based on the first reference voltage;
- (d) generating a second reference voltage and a trigger switch from the stepped-up supply using a fine-resolution reference generator that is associated with the functional circuit unit;
- (e) triggering the hand-off switch circuit with the trigger signal such that the first reference voltage is replaced with a stepped-down second reference voltage as an input reference voltage to the boost regulator;
- (f) stepping down the first output of the second reference voltage and providing the stepped-down second reference voltage to the hand-off switch circuit;
- (g) the boost regulator generating a steady-state stepped-up supply by stepping up the stepped-down second reference voltage.

12. The method of claim 11, wherein the low voltage power is 0.8V to 1.25V, the coarse first reference voltage is 0.6V, the initial-state stepped-up supply is 1.8V, the second reference voltage is 1.25V, the stepped-down second reference voltage is 0.6V, and the steady-state stepped-up supply is 1.8V.

13. The method of claim 11, wherein the integrated circuit device is a system-on-chip device.

14. The method of claim 11, further comprising:
- (h) providing the steady-state stepped-up supply to the functional circuit unit;
- (i) the functional circuit unit generating at least two outputs of the second, more accurate, reference voltage from the steady-state stepped-up supply;
- (j) stepping down the first output of the second reference voltage and providing to the hand-off switch circuit as the input reference voltage to the boost regulator; and
- (k) the boost regulator generating the steady-state stepped-up supply from the second reference voltage.

15. The method of claim 14, wherein the steps (h) through (k) are repeated as long as the low voltage power is being provided to the boost regulator.

* * * * *

UNITED STATES PATENT AND TRADEMARK OFFICE
CERTIFICATE OF CORRECTION

| | | |
|---|---|---|
| PATENT NO. | : 8,674,751 B2 | |
| APPLICATION NO. | : 13/447594 | |
| DATED | : March 18, 2014 | |
| INVENTOR(S) | : Justin Shi et al. | |

It is certified that error appears in the above-identified patent and that said Letters Patent is hereby corrected as shown below:

In the Claims

Column 6, Line 54, Claim 1 delete "fear" and insert --for--

Column 6, Line 61, Claim 1 delete "steped-up" and insert --stepped-up--

Column 7, Line 30, Claim 7 delete "configured." and insert --configured--

Signed and Sealed this
Eleventh Day of November, 2014

Michelle K. Lee
*Deputy Director of the United States Patent and Trademark Office*